United States Patent [19]
Kim

[11] Patent Number: 5,969,416
[45] Date of Patent: Oct. 19, 1999

[54] BALL GRID ARRAY SEMICONDUCTOR PACKAGE

[75] Inventor: Yung-joon Kim, Yongin, Rep. of Korea

[73] Assignee: Samsung Aerospace Industries, Ltd., Rep. of Korea

[21] Appl. No.: 09/156,659

[22] Filed: Sep. 18, 1998

[30] Foreign Application Priority Data

Sep. 19, 1997 [KR] Rep. of Korea ................ 97-47708

[51] Int. Cl.⁶ .................. H01L 23/48; H01L 23/495; H01L 23/28
[52] U.S. Cl. .................. 257/692; 257/676; 257/735; 257/736; 257/784; 257/787
[58] Field of Search .................. 257/676, 692, 257/696, 735, 736, 784, 787; 438/123, 124, 127

[56] References Cited

U.S. PATENT DOCUMENTS

| | | | |
|---|---|---|---|
| 5,157,480 | 10/1992 | McShane et al. | 257/693 |
| 5,172,214 | 12/1992 | Casto | 257/676 |
| 5,302,849 | 4/1994 | Cavasin | 257/666 |
| 5,363,279 | 11/1994 | Cha | 361/767 |
| 5,519,251 | 5/1996 | Sato et al. | 257/666 |
| 5,684,330 | 11/1997 | Lee | 257/692 |
| 5,834,837 | 11/1998 | Song | 257/692 |

FOREIGN PATENT DOCUMENTS

| | | |
|---|---|---|
| 60-34045 | 2/1985 | Japan . |
| 63-258050 | 10/1988 | Japan . |
| 63-296252 | 12/1988 | Japan . |
| 1-255259 | 10/1989 | Japan . |
| 4-147660 | 5/1992 | Japan . |
| 5-114670 | 5/1993 | Japan . |

*Primary Examiner*—Olik Chaudhuri
*Assistant Examiner*—Alonzo Chambliss
*Attorney, Agent, or Firm*—Howrey & Simon

[57] ABSTRACT

A ball grid array semiconductor package including a semiconductor chip, at least one lead having one end attached to the semiconductor chip and other end bent at a predetermined angle, a wire connecting the bent lead to an electrode formed on the semiconductor chip, a first bump attached to a bent end portion of the bent lead, and a resin molding enclosing the semiconductor chip, the lead and the wire to allow one side surface of the bump to be exposed out of the resin molding.

6 Claims, 3 Drawing Sheets

BALL GRID ARRAY SEMICONDUCTOR PACKAGE

BACKGROUND OF THE INVENTION

1. Field of the Invention

The present invention relates to a ball grid array semiconductor package, and more particularly, to a ball grid array semiconductor package in which the number of connection pins are increased by improving the structure of a lead.

2. Description of the Related Art

In the semiconductor industry, Ball Grid Array (BGA) technology is often used to package semiconductor chip. Typically, in a BGA, a semiconductor chip is connected to an end portion of an inner lead and a bump is attached on the bottom surface of the lead. The bump is electrically connected with the terminal on a circuit board through a ball installed on the outer surface of a package mold.

FIG. 1 shows the structure of a conventional BGA semiconductor package. In a semiconductor device 30, a semiconductor chip 35 is installed on the upper surfaces of end portions of lead frames 33 and 33'. A gold wire 37 connects an electrode of the chip 35 and each of the lead frames 33 and 33'. Bumps 39 and 39' are installed at the respective lead frames 33 and 33'. The bottom surfaces of the bumps 39 and 39' are exposed to the outside of the lower surface of a resin mold 36. When the semiconductor chip 35 is mounted on a printed circuit board (PCB), a ball (not shown) is interposed between a port of the PCB and the respective bumps 39 and 39' and then melted to bond the same to each other.

FIG. 2 shows the bottom surface of the BGA semiconductor package. Here, the resin molding is removed from the package.

Referring now to FIG. 2, a plurality of lead frames 41, 42, 43, 44, 41', 42', 43' and 44' are attached on the bottom surface of the chip 35. Bumps 45, 46, 47, 48, 45', 46', 47' and 48' are attached on the leads 41–44', respectively.

As shown in FIG. 2, bumps 45, 46, 47 and 48 are not aligned in a straight line. Rather adjacent bumps are offset from each other by a predetermined distance. Likewise, bumps 45', 46', 47' and 48' are not aligned in a straight line, and adjacent bumps are offset from each other by a predetermined distance. Such a layout increases the number of lead frames that can be connected to the chip 35, and thereby increases the effective area on the PCB that can be utilized to connect the lead frames.

Although, the above described layout increases the number of lead frames that can be connected onto the surface of a PCB, further improvement is desired in the structure of the lead frames as well as the bumps that would allow for an even further increase in the number of lead frames that can be connected to the chip.

SUMMARY OF THE INVENTION

The present invention provides a BGA semiconductor package having an improved structure which allows for an increased number of lead frames to be connected to a semiconductor chip.

Accordingly, to achieve the above objective, there is provided a ball grid array semiconductor package including a semiconductor chip, at least one lead having one end attached to the semiconductor chip and other end bent at a predetermined angle, a wire connecting the bent lead to an electrode port formed on the semiconductor chip, a first bump attached to a bent end portion of the bent lead, and a resin molding enclosing the semiconductor chip, the lead and the wire to allow one side surface of the bump to be exposed out of the resin molding.

It is preferable in the present invention that the ball grid array semiconductor package further includes a plurality of straight leads having one end attached to the semiconductor package, and a second bump attached to each of the straight leads to allow a side surface thereof to be exposed out of the resin molding.

Here, preferably, the bent lead and the straight leads are alternately arranged.

Also, it is preferable in the present invention that the other end of the bent lead is bent at a 90° angle, and that the bumps respectively attached to the straight leads are not aligned in a straight line.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1:
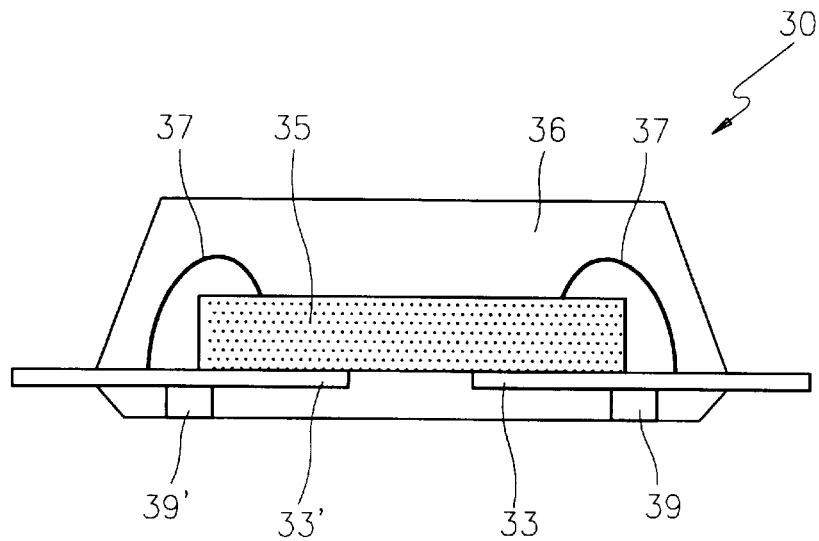
FIG. 1 is a sectional view illustrating an example of a conventional BGA semiconductor package.
Figure 2:
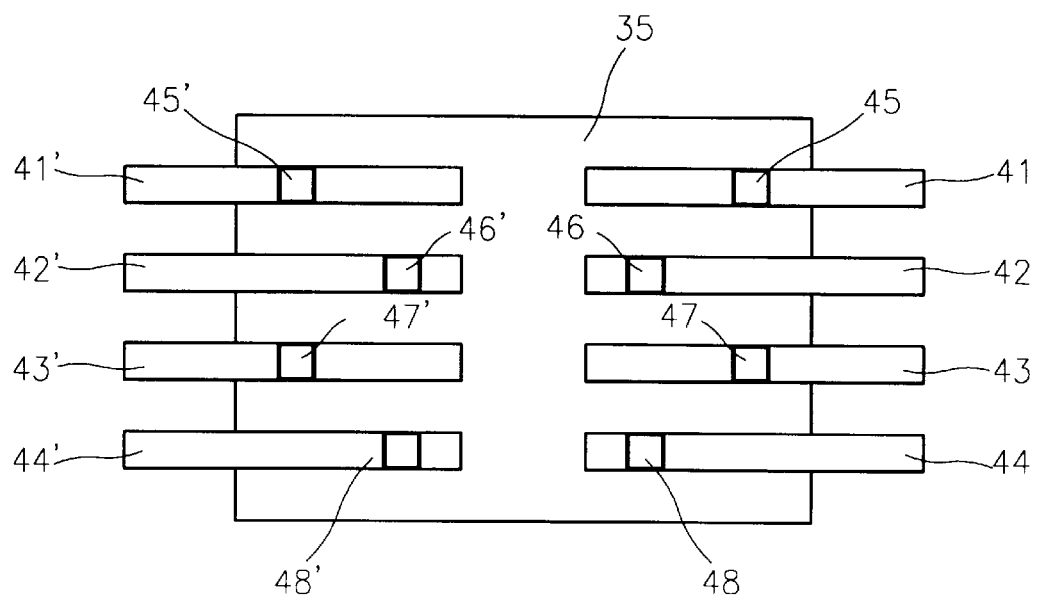
FIG. 2 is a bottom view illustrating another example of the conventional BGA semiconductor package.
Figure 3:
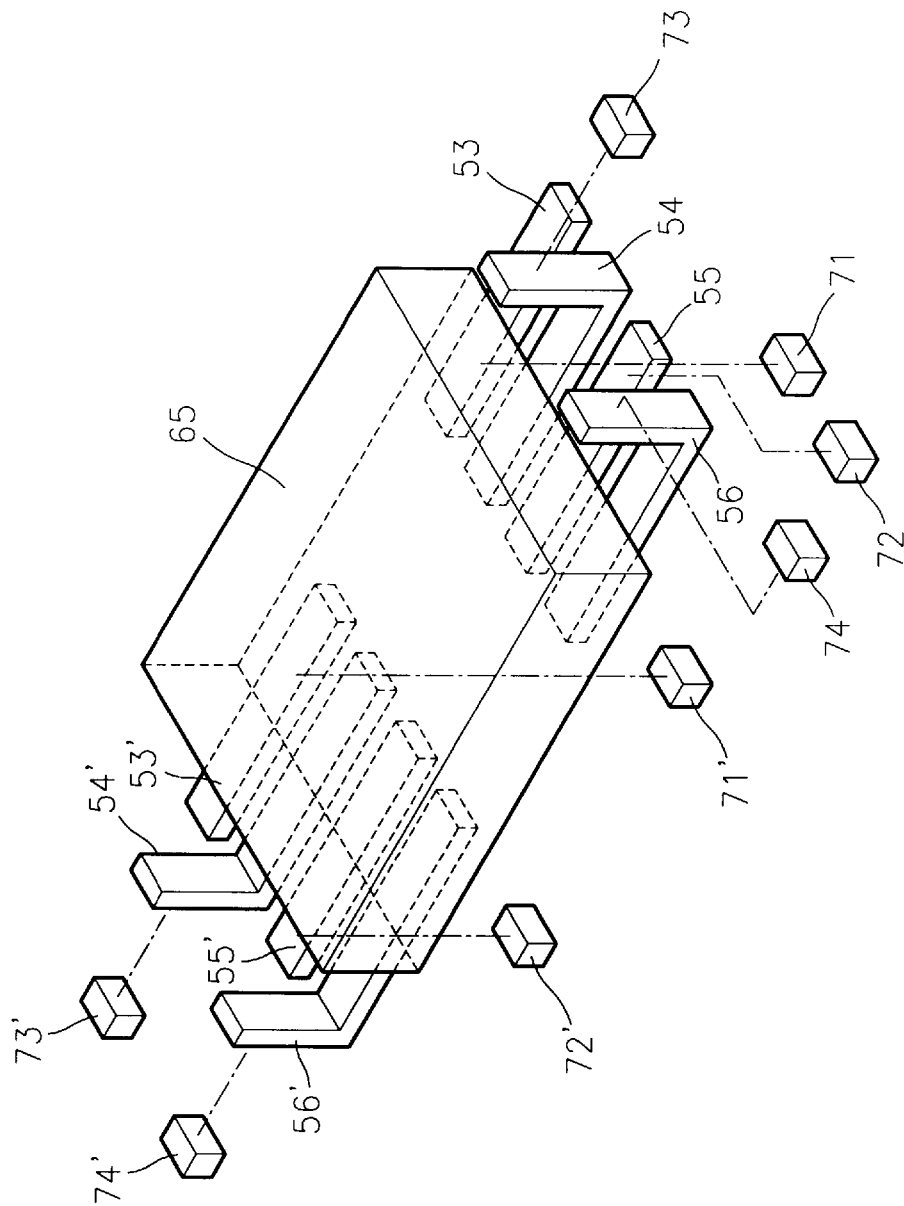
FIG. 3 is an exploded perspective view illustrating a portion of a BGA semiconductor package according to the present invention.

FIG. 3 illustrates a perspective view of a BGA semiconductor package in accordance with one embodiment of the present invention, wherein a resin molding enclosing the semiconductor package and bonding wires are removed. Referring now to FIG. 3, end portions of a plurality of leads 53, 54, 55, 56, 53', 54', 55' and 56' are attached to the bottom surface of a semiconductor chip 65. According to the present invention, at least one of the leads 53–56' is bent in the lengthwise direction of the lead at a predetermined angle. Preferably, the leads 54, 56, 54' and 56' are horizontally extended from the bottom surface of the chip 65 and bent vertically. Also, it is preferable that the bent leads 54, 56, 54' and 56' are alternately interposed between unbent leads 53, 55, 53' and 55'.

Bumps 71, 72, 73, 74, 71', 72', 73' and 74' are attached to the leads 53–56', respectively. That is, the bumps 71, 72, 71' and 72' are attached to the bottom surfaces of the straight leads 53, 55, 53' and 55', and the bumps 73, 74, 73' and 74' are attached to the vertical side portions of the bent leads 54, 56, 54' and 56'. Here, the bumps 71, 72, 71' and 72' attached to the straight leads 53, 55, 53' and 55' are preferably not arranged linearly.

Figure 4:
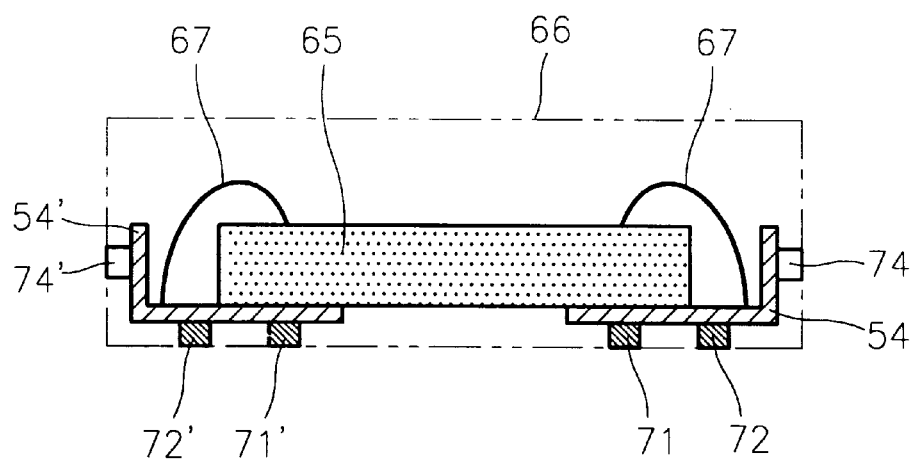
FIG. 4 is a front view of the BGA semiconductor package shown in FIG. 3 illustrating the BGA semiconductor package of the present invention.

FIG. 4 shows a side view of a BGA semiconductor package in accordance with the present invention in which the chip and the leads are molded with resin indicated by a phantom line. The respective leads 53–56' (see FIG. 3) attached to the bottom surface of the chip 65 are electrically connected to an electrode of the chip 65 by a gold wire 67. A resin mold 66 encloses the chip 65 and the leads 53–56'. Here, the bumps 73, 74, 73' and 74' (see FIG. 3) respectively attached to the bent leads 53, 55, 53' and 55' are exposed out of the side surface of the resin molding 66, and the bumps 71, 72, 71' and 72' respectively attached to the straight leads 53, 55, 53' and 55' are exposed out of the bottom surface of the resin molding 66.

Referring again to FIG. 4, the BGA semiconductor package is coupled to a socket (not shown) provided on a printed circuit board (not shown). Connection ports corresponding to the bumps 71–74' which are exposed out of the bottom surface and the side surface of the resin molding 66 are formed on the socket. The bumps and the connection ports are electrically connected by a ball (not shown) interposed therebetween.

As it will be appreciated by one skilled in the art, both FIGS. 3 and 4 illustrate dual in-line packages (DIPs). However, the present invention can also be applied to single in-line packages (SIPs) and quad flat packages (QFPs).

As described above, the package of the present invention has straight leads and bent leads so that a sufficient area for attachment is secured. Thus, a large number of bumps can be easily attached and the number of leads can be maximized.

It is noted that the present invention is not limited to the preferred embodiment described above, and it is apparent that variations and modifications by those skilled in the art can be implemented within the spirit and scope of the present invention.

What is claimed is:

1. A ball grid array semiconductor package comprising:

a semiconductor chip;

at least one lead having one end attached to said semiconductor chip and other end bent at an angle;

at least one straight lead having one end attached to said semiconductor chip;

a wire connecting said lead to an electrode formed on said semiconductor chip;

a first bump formed at said bent lead;

a second bump formed at said straight lead; and a resin molding enclosing said semiconductor chip, said bent lead, said straight lead and said wire to allow a side surface of said first bump and said second bump to be exposed out of said resin molding, wherein said first bump is exposed through a side surface of said resin molding and said second bump is exposed through a bottom surface of said resin molding.

2. The ball grid array semiconductor package as claimed in claim 1, wherein said bumps respectively attached to said bent leads are aligned in a straight line that is perpendicular to said bent leads.

3. The ball grid array semiconductor package as claimed in claim 1, wherein said bent lead and said straight leads are alternatively arranged.

4. The ball grid array semiconductor package as claimed in claim 1, wherein said other end of said bent lead is bent at a 90° angle.

5. The ball grid array semiconductor package as claimed in claim 1, wherein said bumps respectively attached to said straight leads are aligned non-linearly.

6. The ball grid array semiconductor package as claimed in claim 1, wherein said bumps respectively attached to said bent leads are aligned linearly.

* * * * *